United States Patent
Okamoto et al.

(10) Patent No.: US 10,504,706 B2
(45) Date of Patent: Dec. 10, 2019

(54) SPUTTERING TARGET AND METHOD FOR PRODUCING THE SAME

(75) Inventors: Ken Okamoto, Tokyo (JP); Tadahisa Arahori, Tokyo (JP); Akishige Sato, Tokyo (JP); Sachio Miyashita, Tokyo (JP); Eiji Kusano, Ishikawa (JP); Muneaki Sakamoto, Ishikawa (JP)

(73) Assignee: Ferrotec Ceramics Corporation, Tokyo (JP)

( * ) Notice: Subject to any disclaimer, the term of this patent is extended or adjusted under 35 U.S.C. 154(b) by 818 days.

(21) Appl. No.: 14/355,959

(22) PCT Filed: Apr. 10, 2012

(86) PCT No.: PCT/JP2012/059795
§ 371 (c)(1),
(2), (4) Date: Jan. 15, 2015

(87) PCT Pub. No.: WO2013/065337
PCT Pub. Date: May 10, 2013

(65) Prior Publication Data
US 2015/0122642 A1 May 7, 2015

(30) Foreign Application Priority Data

Nov. 4, 2011 (JP) ................. 2011-242540

(51) Int. Cl.
| | |
|---|---|
| C23C 14/35 | (2006.01) |
| H01J 37/34 | (2006.01) |
| C04B 35/111 | (2006.01) |
| G11B 5/851 | (2006.01) |
| C04B 35/645 | (2006.01) |
| C23C 14/08 | (2006.01) |
| C23C 14/34 | (2006.01) |
| G11B 5/31 | (2006.01) |
| G11B 11/105 | (2006.01) |

(52) U.S. Cl.
CPC ......... *H01J 37/3426* (2013.01); *C04B 35/111* (2013.01); *C04B 35/645* (2013.01); *C23C 14/081* (2013.01); *C23C 14/3414* (2013.01); *G11B 5/851* (2013.01); *H01J 37/3491* (2013.01); *C04B 2235/656* (2013.01); *C04B 2235/6567* (2013.01); *C04B 2235/663* (2013.01); *C04B 2235/72* (2013.01); *C04B 2235/77* (2013.01); *C04B 2235/785* (2013.01); *C04B 2235/786* (2013.01); *C04B 2235/963* (2013.01); *G11B 5/3106* (2013.01); *G11B 11/10586* (2013.01); *H01J 2237/332* (2013.01)

(58) Field of Classification Search
CPC .......................... H01J 37/3426; C23C 14/081
See application file for complete search history.

(56) References Cited

U.S. PATENT DOCUMENTS

| | | | | |
|---|---|---|---|---|
| 4,004,452 A | * | 1/1977 | Logothetis | G01N 27/12 338/34 |
| 6,835,251 B2 | * | 12/2004 | Perry | C23C 14/3414 148/437 |
| 2004/0170347 A1 | * | 9/2004 | Ikeda | C04B 35/115 384/492 |

FOREIGN PATENT DOCUMENTS

| | | |
|---|---|---|
| CN | 101985735 | 3/2011 |
| JP | 60-181270 | 9/1985 |
| JP | 06-299347 | 10/1994 |
| JP | 09-095773 | 4/1997 |
| JP | 11-240720 | 9/1999 |
| JP | 11-241160 | 9/1999 |
| JP | 2000-064034 | 2/2000 |
| JP | 2001-064424 | 3/2001 |
| JP | 2001-348265 | 12/2001 |
| JP | 2001348265 A * | 12/2001 |
| JP | 2006-205558 | 8/2006 |
| JP | 2010-087293 | 4/2010 |
| KR | 10-2006-0043427 | 5/2006 |
| KR | 10-2008-0113258 | 12/2008 |
| TW | 201026629 | 7/2010 |
| WO | 2010/018707 | 2/2010 |

OTHER PUBLICATIONS

Alford, "Sintered alumina with low dielectric loss". J. Appl. Phys. 80 (10), Nov. 15, 1996. pp. 5895-5898 (Year: 1996).*
Risbud, "Retention of nanostructure in aluminum oxide by very rapid sintering at 1150° C.". J. Mater. Res., vol. 10, No. 2, Feb. 1995. pp. 237-239. (Year: 1995).*
U.S. Appl. No. 14/355,988, filed May 2, 2014, Ken Okamoto et al.

* cited by examiner

*Primary Examiner* — Jason Berman
(74) *Attorney, Agent, or Firm* — Clark & Brody

(57) ABSTRACT

A sputtering target which is made of an alumina sintered body having a purity of not less than 99.99% by mass %, a relative density of not less than 98%, and an average grain size of less than 5 μm or is made of an alumina sintered body having a purity of not less than 99.999% by mass % and a relative density of not less than 98%. A sputtered film having an excellent insulation resistance and an excellent homogeneity can be obtained by using the sputtering target.

2 Claims, No Drawings

SPUTTERING TARGET AND METHOD FOR PRODUCING THE SAME

TECHNICAL FIELD

The present invention relates to a sputtering target and a method for producing the same.

BACKGROUND ART

Sputtering is a method of depositing a film on a substrate by accelerating ions typically by means of glow discharge so as to hit a sputtering target so that the target ejects a material for the film due to the kinetic energy of the ions. It is widely used as a tool for fabricating structures such as thin film devices in the areas of semiconductors, liquid crystals, solar cells, and so on. Among others, a target using an alumina sintered body (hereinafter, also referred to as an "alumina target") is used as a source of film materials in forming a protective film or an insulating film in magnetic heads, magneto-optical disks and the like. It is also used for forming a wear resistant film on cemented carbide tools.

Since an alumina target is usually an insulating material, a high-frequency sputtering apparatus is used for forming an alumina sputtered film. In this apparatus, an alumina target is joined to an electrode, a substrate is disposed at a counter electrode of the electrode, and a sputtering discharge is carried out in an atmosphere such as argon under a reduced pressure, thereby depositing an alumina film on the substrate.

Patent Document 1 discloses an alumina sputtering target which uses an alumina sintered body having an average grain size of not less than 5 µm and not more than 20 µm, and a porosity of not less than 0.3% and not more than 1.5%. Particularly, it is described in claim 2 thereof that an alumina sintered body having a purity of not less than 99.9% (generally, called as "three nine" and denoted as "3N") is used, and is also shown in an embodiment that an example using alumina powder of 3N is used.

CITATION LIST

Patent Document

[Patent Document 1] JP2000-64034A

SUMMARY OF INVENTION

Technical Problem

It is suggested that the alumina sputtering target of Patent Document 1 is in nature less likely to have failures such as large cracks and fractures even when a high electric power is applied, or abnormal discharging, arcing, or the like occurs.

However, in recent years, as the sophistication and miniaturization of devices advance, there is an increasing demand for reducing the thickness of sputtered films, and thus requirements for the physical properties of thin films are becoming stricter. To impart excellent insulation resistance and homogeneity to a sputtered film, it is not sufficient that failures such as cracks and fractures will not occur in the target due to the power during sputtering. Moreover, to reduce impurities in the sputtered film, it is effective to increase the purity of the target material. In Patent Document 1, only an alumina sintered body having a purity of not less than 99.9% (3N) has been studied, and there is a limitation to obtain higher physical properties.

On the other hand, in order to reduce the thickness of an insulation film, besides the film material itself having a high dielectric breakdown voltage and high reliability, the film quality of the sputtered film such as a film thickness distribution should be homogeneous, otherwise it will become difficult to design a high performance device. However, in the past, these technical issues have not been studied.

It is an object of the present invention to provide a sputtering target which can impart excellent insulation resistance and homogeneity to a sputtered film to be formed by sputtering, and a method of producing the same.

Solution to Problem

In order to solve the above described problems, the present inventors have diligently studied the physical properties of an alumina thin film to be used as an insulating layer of various devices, in particular, insulation resistance and homogeneity of a sputtered film formed by sputtering. As a result, the present inventors have found out that a further purification of the alumina sintered body which is a raw material of the target is required, and the purity needs to be not less than 99.99% (4N), even not less than 99.999% (5N), and that it is effective to improve the relative density and crystal grain size of a high purity alumina sintered body, eventually completing the present invention.

The gist of the present invention is sputtering targets of items (1) to (6) and (8) described below, and a method for producing the sputtering targets according to item (7) described below.

(1) A sputtering target made of an alumina sintered body which has a purity of not less than 99.99% by mass %, a relative density of not less than 98%, and an average grain size of less than 5 µm.

(2) A sputtering target made of an alumina sintered body which has a purity of not less than 99.999% by mass % and a relative density of not less than 98%.

(3) The sputtering target according to item (2), in which the average grain size is less than 5 µm.

(4) The sputtering target according to any one of items (1) to (3), in which the relative density is not less than 99%.

(5) The sputtering target according to any one of items (1) to (3), in which the average grain size is less than 2 µm.

(6) The sputtering target according to item (4), in which the average grain size is less than 2 µm.

(7) A method for producing a sputtering target made of an alumina sintered body having a purity of not less than 99.99% by mass %, comprising: performing a hot-press sintering at 1250 to 1350° C. to obtain the sintered body; and thereafter performing an annealing treatment at 1300 to 1700° C. in an atmosphere.

(8) A sputtering target, which is obtained by the production method according to item (7).

Advantageous Effects of Invention

The sputtering target of the present invention allows a sputtered film, which is formed by sputtering using the concerned target, to have an excellent insulation resistance, a small surface roughness, and an excellent homogeneity. Such a sputtered film having an excellent insulation resistance and an excellent homogeneity will provide a film that has stable electrical properties and permittivity even in an ultrathin film.

DESCRIPTION OF EMBODIMENTS

1. Purity of Alumina Sintered Body

In a sputtering target relating to the present invention, an alumina sintered body having a purity of not less than 99.99% (4N) by mass % needs to be used. With an alumina sintered body having a purity of not less than 99.9% (3N), it is not possible to impart an excellent dielectric breakdown voltage and good surface roughness to a sputtered film which is obtained by using the concerned sintered body as the target even if various countermeasures such as performing a hot-press sintering and an annealing treatment as described below are taken. In contrast to this, an alumina sintered body having a purity of not less than 99.99% (4N) has a satisfactory relative density and average grain size even without performing such a special heat treatment as described above. It is possible to impart excellent dielectric breakdown voltage and good surface roughness to a sputtered film which is to be obtained by sputtering using the concerned sintered body as the target. In particular, it is preferable that the sintered body does not contain alkali metals and halogens.

In a sputtering target relating to the present invention, it is also possible to use an alumina sintered body having a purity of, by mass %, not less than 99.999% (5N). It is noted that, with a sputtering target made of an alumina sintered body of 5N, as well as with a sputtering target made of an alumina sintered body of 4N, it is possible to obtain a sputtered film having far more excellent physical properties compared with the case of a sputtering target made of an alumina sintered body of 3N.

An alumina sintered body is obtained by firing a raw powder having a level of purity equal to a target purity. Here, generally, a 4N alumina sintered body is produced by subjecting a raw powder of not less than 4N to preprocessing such as pulverization, classification and granulation, and thereafter forming and sintering it. On the other hand, when producing a 5N alumina sintered body as well, a raw powder having a purity of not less than 5N is used and the same production process is adopted. However, as for the steps of pulverization, classification, and granulation etc., these are a process in which the pulverized body is directly treated and therefore impurities originated from the facility are relatively likely to be mixed into the pulverized body. There will be no problem when the raw powder has a purity of 4N, but to maintain a purity of 5N (impurities are less than 10 ppm), it is difficult to secure a 5N purity after the forming step, by means of an ordinary production facility.

On the other hand, when the forming and sintering are performed without performing the grain size control of the alumina raw powder, it is relatively easy to maintain the purity. However, since the grain size distribution of the pulverized body is not controlled, the formability or the sinterability is inferior and it is difficult to obtain a dense sintered body. Although a pressureless dense sintering with a raw powder having a purity of not less than 5N is also possible if a dedicated grain size distribution control facility is used under a very clean environment, and countermeasures such as refining the raw powder after grain size distribution control are taken, the production cost including facility investment will extremely increase. Therefore, in the case of an alumina sintered body of 5N, it is preferable to perform a hot-press sintering to be described later rather than a pressureless sintering by an ordinary atmospheric furnace. Although, as means for densifying a pressureless sintered body afterwards, an HIP method is known, the crystal grains grow during an HIP processing, making it difficult to control the average grain size to be less than 5 µm.

2. Relative Density

When a large number of pores are present in an alumina sintered body, the largest inclusions will be gas having an air composition and water, and when its relative density is low, a density decrease and abnormal growth of the sputtered film to be obtained by sputtering may be caused even if it is a high purity alumina sintered body, thereby leading to a decrease in the dielectric breakdown voltage. When the relative density (a value in percentage of a measured density divided by a theoretical density) of a sputtering target is low, the surface roughness of the sputtered film, which is to be obtained by sputtering using the concerned target, increases, thereby adversely affecting the homogenization of the thin film. Further, the number of pores in the base material increases, and a small amount of moisture is adsorbed in the base material so that water is released during the sputtering process, adversely affecting the property of the sputtered film. Therefore, the relative density needs to be not less than 98%. Although it is a prerequisite that the grain growth in a sintering procedure can be restricted in a range of the average grain size to be described later, the relative density is preferably not less than 99%, and more preferably not less than 99.5%.

3. Average Grain Size

When the average grain size of a sputtering target is large, the surface roughness of the sputtered film, which is to be obtained by sputtering using the concerned target, increases, thereby adversely affecting the homogenization of the thin film. Therefore, the average grain size is preferably as small as possible. Particularly, the average grain size is preferably not more than 10 µm. The average grain size is more preferably less than 5 µm, and further preferably not more than 2 µm. However, an alumina sintered body having a purity of 4N needs to have an average grain size of less than 5 µm.

It is noted that, according to the study by the present inventors, raising the purity of the sputtering target from 3N to 4N, further to 5N will have positive effects on the physical properties of the sputtered film. However, as described above, concerning an alumina sintered body of 5N, since a technique to produce a dense sintered body by a pressureless sintering with an atmospheric furnace at a low cost is not established at the present time, it is effective to produce it by a hot-press sintering. In this respect, since with an alumina sintered body of 4N, a dense sintered body can be obtained even by a pressureless firing in an atmospheric furnace (that is, the average grain size can be made less than 5 µm), it is possible to obtain a high performance target at a lower cost than with an alumina sintered body of 5N.

4. Method of Producing Sputtering Target

Concerning a method of producing a sputtering target relating to the present invention, there is no specific limitation, and the production may be conducted by sintering in an atmospheric furnace. Sintering in an atmospheric furnace can be conducted, for example, by forming a raw powder having a level of purity equal to a target purity, and thereafter holding the same in an atmospheric furnace of 1250 to 1700° C. for 30 to 600 minutes. Concerning the forming, a technique such as a CIP and a die press forming etc. can be adopted, and a grain size distribution control and a granulation with addition of a binder etc. may be performed appropriately before the forming. When the temperature of the atmospheric furnace is less than 1250° C., it is not possible to obtain a dense sintered body, and the homogeneity and dielectric breakdown voltage of the sputtered film will deteriorate. Moreover, since a sintered body which is sintered at such a low temperature is porous and has a poor strength, there is a risk that the target may fail due to abnormal discharging during a sputtering process, etc. and the target base material itself may scatter as particles causing defects of the sputtered film.

It is noted that steps such as grain size distribution control and granulation of the raw powder before the forming may cause deterioration of purity, and therefore a particular attention has to be paid to the maintenance of the purity of raw material. Moreover, since the outermost layer portion of a sintered body is prone to be contaminated by impurity elements originating from firing furnace materials etc., it is preferable that the entire surface is removed by grinding.

On the other hand, when the temperature of the atmospheric furnace exceeds 1700° C., the grain growth becomes excessive and coarse grains occur non-uniformly, thus deteriorating the homogeneity of the sputtered film thickness. Moreover, if non-uniform coarse crystal grains are present in a target, large particles may fall off as a foreign substance into a processing chamber with the progress of sputtering. When the falling off occurs and the surface of the target is roughened, the homogeneity of the sputtered film may be deteriorated. When the holding time is less than 30 minutes, the entire material being processed will not reach a targeted density and grain size, causing variation of physical properties in the same base material. On the other hand, when the holding time exceeds 600 minutes as well, non-uniform coarse grains occur, and there is a risk of causing deterioration of the sputtered film quality.

A sputtering target relating to the present invention can also be produced by obtaining an alumina sintered body. The alumina sintered body can be obtained by performing a hot-press sintering at 1250 to 1350° C., and thereafter performing an annealing treatment at 1300 to 1700° C. in the atmosphere. When a hot-press sintering is used, it is general that powder raw material having a purity equivalent to that of the sintered body of interest is charged into a mold made of carbon, and is subjected to uniaxial pressure sintering in vacuum or in a non-oxidizing atmosphere such as nitrogen and argon.

When the temperature of the hot-press sintering is less than 1250° C., the density of the sintered body cannot be secured sufficiently, thereby leading to deterioration of the homogeneity and dielectric breakdown voltage of the sputtered film. On the other hand, when the temperature exceeds 1350° C., although it is possible to obtain a dense sintered body having a density close to a theoretical density, many oxygen defects occur in the sintered body, and as the oxygen defects increase, the coloration of the sintered body changes from white to gray to black. When such a sintered body which lacks oxygen is used for the sputtering target, the sputtered film will lack oxygen as well, leading to deterioration of film physical properties such as dielectric breakdown voltage, etc. Even when an annealing step to be described later is performed, the removal of oxygen defects is limited to in an outer layer, and the removal of oxygen defects in an inner layer portion is difficult.

It is noted that while oxygen defects occur even when the hot-press temperature is not more than 1350° C., they can be removed by an atmospheric annealing step to be described later.

On the other hand, in sputtering, it is also possible to supplement oxygen, which is deficient in the target material, during film deposition by adding oxygen to the process gas. However, while oxygen atoms originating from the target reaches a very high temperature range of more than 10000K at the instance of sputtering, the oxygen atoms that are supplied from the outside as the process gas are at low temperature, and therefore are less likely to be taken into the sputtered film. Consequently, the film quality is unstabilized such as by microdefects (vacancies) being confined in the sputtered film, and there may be a case in which the dielectric breakdown voltage is extremely deteriorated. In addition, in a sputtering added with oxygen, it is necessary to reduce the deposition rate, thus adversely affecting the yield, and involving the aging of the film quality. Therefore, a target containing oxygen defects is not suitable for the formation of an insulating film which is ultrathin and reliable.

The hot-press sintering is preferably performed, for example, for a range of 30 to 600 minutes. When the press time is less than 30 minutes, heat transfer and sintering will not reach a stable state, and overall densification becomes insufficient, or only the outer periphery is densified resulting in accumulation of residual stress so that the target base material may be broken by the impact of sputtering. On the other hand, when the press time exceeds 600 minutes, the crystal grain growth and oxygen defects of the sintered body increase, and when this sintered body is used as the target material, it is difficult to obtain a high quality sputtered film.

The pressure of the hot-press sintering is preferably not less than 10 MPa. When the pressure is less than 10 MPa, pressurizing force becomes insufficient, thus causing occurrence of a density decrease and a local density unevenness in the base material. There is no particular restriction on the upper limit of the pressure within a range the plant capacity allows.

When an atmospheric annealing treatment is not performed, or when the temperature thereof is less than 1300° C. even if it is performed after hot-press sintering, because oxygen defects in the sintered body cannot be removed to a sufficient level, the quality of the sputtered film will deteriorate as described above. On the other hand, when the annealing temperature exceeds 1700° C., the grain growth becomes excessive, and coarse grains occur non-uniformly, thereby deteriorating the homogeneity of the sputtered film thickness. Further, when non-homogeneous coarse grains are present in the target, large grains may fall off into the processing chamber as a foreign matter with the progress of sputtering. If the falling off takes place and the surface of the target is roughened, the homogeneity of the sputtered film may be deteriorated.

The atmospheric annealing treatment is preferably performed, for example, for a range of 30 to 600 minutes. When the annealing time is less than 30 minutes, the entire material will not reach a targeted density and grain size, causing variation of physical properties in the same base material. On the other hand, when the annealing time exceeds 600 minutes, a problem may occur in that non-homogeneous coarse grains take place due to excessive grain growth, thereby leading to deterioration of the sputtered film quality.

In particular, by adjusting the relative density of the sintered body to be 90 to 98% at the above described hot-press conditions, and by proceeding with a sintering process in an atmospheric annealing process to make the relative density to be not less than 98%, or preferably not less than 99%, it becomes possible to proceed with the removal of oxygen defects and the control of the density and the grain size at the same time. Thus obtained sputtering target will be one having a high density and fine crystal grains, and containing almost no oxygen defect. Further, the removal of oxygen defects can be confirmed by whitening of the sintered body.

Machining of a sintered body is preferably performed by wet grinding using a grinding stone including typical diamond abrasive grains. Polishing process such as lapping and/or surface roughening process such as sand blasting may be added as desired. After a grinding process, it is effective to sufficiently remove grinding liquid and grinding chips, which adhere onto the outer layer, by using a method such as chemical cleaning, pure water ultrasonic cleaning, and the like.

Example 1

In order to confirm advantageous effects of the present invention, alumina having purities shown in Table 1 were prepared, and targets (discs having a diameter of 75 mm and a thickness of 5 mm) were produced at various production conditions shown in Table 1.

<Relative Density of Sintered Body>

Apparent densities were measured by an Archimedes method conforming to JIS R 1634, and supposing the theoretical density of alumina to be 3.987 g/cm$^3$, relative densities (%) with respect to this value were determined.

<Average Grain Size of Sintered Body>

A specimen which was mirror-polished to a surface roughness of less than Ra: 0.05 μm, was cut out from an inner layer portion of each sintered body, and was subjected to a chemical etching treatment with hot concentrated phosphoric acid until the crystal grains were exposed. Thereafter, photographs of crystal grains were taken with a scanning electron microscope (SEM) and thereafter, conforming to JIS R 1670, an average grain size (μm) was calculated by drawing an equivalent circle for each grain in any visual field in which N=100 was secured, and tallying grain sizes.

<Purity of Sintered Body>

A sintered body was subjected to a pre-processing such as alkali fusion to form a solution, and quantitative analysis of 17 elements including Mg, Si, Fe, Cu, Ca, Cr, Ti, Ni, Mo, W, Co, Y, Zn, Mn, Li, Na, and K was conducted with an inductively coupled plasma atomic emission spectrometry (ICP-AES) and a flame spectrophotometer (targeted for Li, Na, and K). Thereafter, quantitative values of the detected elements were converted into those of oxide, and a purity of an alumina sintered body was determined by subtracting the quantitative values of the oxide from 100%.

It is noted that among the determined purities of the sintered bodies, those of not less than 99.9% and less than 99.99% were referred to as 3N, those of not less than 99.99% and less than 99.999% as 4N, and those of not less than 99.999% as 5N.

<Surface Finish of Sputtering Target>

Centerline average roughness (Ra) of the ground surface of each target material, whose erosion surface was subjected to finish processing by using a #400 grinding stone, was in a range: Ra=0.2 to 0.8 μm.

An experiment was conducted such that the above described various targets were mounted in a chamber of a load lock type ultra-high vacuum high-frequency sputtering apparatus, and a film was deposited to measure and evaluate physical properties of the obtained sputtered film. The results are shown in Table 1.

It is noted that film formation was conducted by using 99.9995% Ar gas as the discharge gas, with a flow rate of 10 sccm, and a discharge voltage of 0.4 Pa. The achieved pressure during film forming was $2.0 \times 10^{-4}$ Pa. The input power was 150 W. A 50 mm square borosilicate glass and a glass with a doped indium tin oxide (ITO) film having silver electrodes with a width of 5 mm on opposite ends of the upper surface of the ITO were used as the substrates, and an alumina sputtered film was deposited thereon in a film thickness of 400 nm. In a measurement sample for dielectric breakdown voltage, Cu electrodes each having a diameter of 3 mm and a film thickness of 100 nm were formed at 9 positions by sputtering on the alumina sputtered film. It is noted that the below described measurements were conducted on thin films which were deposited after the target input power reached 4.5 kWh.

<Surface Roughness of Sputtered Film>

The surface roughness Ra (nm) of a sputtered film was measured by a scanning probe microscope (AFM) under the conditions: an excitation voltage of 1.36V, a scanning range of 1000 nm, a lever length of 125 μm, and a needle height of 10 μm.

<Dielectric Breakdown Voltage of Sputtered Film>

An electrochemical analyzer was used to measure dielectric breakdown voltage values of a sputtered film at 9 positions where the Cu top electrodes were provided, under the conditions of a measurement potential of 0 to 5V, and a scanning rate of 0.01 V/s, and an average value for the 9 positions was determined as a dielectric breakdown voltage of the sputtered film.

TABLE 1

| | Alumina raw material | | Production method | | | | Evaluation | | | |
| | | | | | | | Sintered body | | Sputtered film | |
| No. | Purity (%) | Clasification | Sintering Temperature (° C.) | Method | Annealing Temperature (° C.) | Coloration | Relative density (%) | Average grain size (μm) | Dielectric breakdown voltage (MV/m) | Ra (nm) |
| --- | --- | --- | --- | --- | --- | --- | --- | --- | --- | --- |
| 1 | 99.993 | 4N | 1,200 | Atmospheric furnace | Without | White | 83.1 | 0.5 | 0.8 | 1.85 |
| 2 | 99.993 | 4N | 1,250 | Atmospheric furnace | Without | White | 98.1 | 1.2 | 10.5 | 0.11 |
| 3 | 99.993 | 4N | 1,300 | Atmospheric furnace | Without | White | 98.8 | 1.5 | 7.5 | 0.15 |
| 4 | 99.92 | 3N | 1,300 | Atmospheric furnace | Without | White | 98.2 | 1.5 | 3.0 | 1.53 |
| 5 | 99.991 | 4N | 1,600 | Atmospheric furnace | Without | White | 99.0 | 4.8 | 5.1 | 0.31 |
| 6 | 99.991 | 4N | 1,750 | Atmospheric furnace | Without | White | 99.2 | 13.5 | 1.8 | 1.25 |
| 7 | 99.999 | 5N | 1,250 | Hot-press | Without | Gray | 97.5 | 1.1 | 0.6 | 0.55 |
| 8 | 99.999 | 5N | 1,250 | Hot-press | 1,300 | White | 98.1 | 1.5 | 10.4 | 0.12 |
| 9 | 99.999 | 5N | 1,280 | Hot-press | 1,600 | White | 99.2 | 7.2 | 6.5 | 0.46 |
| 10 | 99.999 | 5N | 1,280 | Hot-press | 1,500 | White | 99.0 | 4.7 | 8.5 | 0.26 |

TABLE 1-continued

| | Alumina raw material | | Production method | | | | Evaluation | | | |
| | | | Sintering | | Annealing | | Sintered body | | Sputtered film | |
| No. | Purity (%) | Classification | Temperature (° C.) | Method | Temperature (° C.) | Coloration | Relative density (%) | Average grain size (μm) | Dielectric breakdown voltage (MV/m) | Ra (nm) |
|---|---|---|---|---|---|---|---|---|---|---|
| 11 | 99.993 | 4N | 1,280 | Hot-press | 1,500 | White | 99.8 | 4.5 | 6.5 | 0.35 |
| 12 | 99.999 | 5N | 1,650 | Hot-press | 1,600 | Gray | 99.5 | 12.0 | 1.6 | 0.95 |
| 13 | 99.91 | 3N | 1,250 | Hot-press | 1,300 | White | 98.0 | 1.4 | 3.2 | 1.42 |

As shown in Table 1, as for No. 1, although the purity of the raw material was 4N, since the sintering temperature was as low as 1200° C., the sintered body had a low relative density and became porous. As a result, vacancies remained in the sputtered film, which was obtained by sputtering using the concerned sintered body as the target, so that the dielectric breakdown voltage deteriorated to an extreme and the homogeneity of the film became poor as well. As for Nos. 2 and 3 in which the purity was 4N, both of the relative density and the average grain size were satisfactory so that the sputtered films, which were obtained by sputtering using the concerned sintered bodies as the target, exhibited satisfactory results both in the dielectric breakdown voltage and the homogeneity.

As for No. 4, since the purity of the raw material was 3N, although both of the relative density and the average grain size of the sintered body were satisfactory, the sputtered film, which was obtained by sputtering using the concerned sintered body as the target, exhibited no more than a medium result in the dielectric breakdown voltage, and a poor result in the homogeneity. As for No. 5 in which the purity was 4N, the sintered body exhibited satisfactory results both in the relative density and the average grain size so that the sputtered film, which was obtained by sputtering using the concerned sintered body as the target, exhibited satisfactory results both in the dielectric breakdown voltage and the homogeneity. However, since the sintering was conducted at a relatively high temperature, those results were not better than those of No. 3.

As for No. 6, although the purity was 4N, since a pressureless sintering was conducted in an atmospheric furnace which was kept at an excessively high temperature, the average grain size increased so that both of the dielectric breakdown voltage and the homogeneity of the sputtered film, which was obtained by sputtering using the concerned sintered body as the target, deteriorated. As for No. 7 in which the purity was 5N, although hot-press sintering was conducted, since annealing treatment was not conducted thereafter, the relative density was insufficient so that the dielectric breakdown voltage of the sputtered film, which was obtained by sputtering using the concerned sintered body as the target, deteriorated.

As for Nos. 8 to 10 in which the purity was 5N, both of the relative density and the average grain size were satisfactory so that the sputtered films, which were obtained by sputtering using the concerned sintered bodies as the target, exhibited satisfactory results both in the dielectric breakdown voltage and the homogeneity. As for No. 11 in which the purity was 4N, both of the relative density and the average grain size were satisfactory so that the sputtered film, which was obtained by sputtering using the concerned sintered body as the target, exhibited satisfactory results both in the dielectric breakdown voltage and the homogeneity. In No. 12, although the purity was 5N, since the hot-press temperature was too high, there was a problem that the sintered body was densified with many oxygen defects being contained inside, and the oxygen defects were not able to be removed even by an atmospheric annealing thereafter; and the sputtered film, which was obtained by sputtering using the concerned sintered body as the target, exhibited poor results both in the dielectric breakdown voltage and the homogeneity. As for No. 13 in which the purity was 3N, although both of the relative density and the average grain size were satisfactory, the sputtered film, which was obtained by sputtering using the concerned sintered body as the target, exhibited poor homogeneity.

INDUSTRIAL APPLICABILITY

A sputtering target of the present invention can allow the sputtered film which is formed by sputtering using the concerned target to have an excellent insulation resistance, a small surface roughness, and an excellent homogeneity. Such a sputtered film having an excellent insulation resistance and an excellent homogeneity provides a film having stable electrical properties and a permittivity even in a ultrathin film.

The invention claimed is:

1. A sputtering target made of an alumina sintered body which has a purity of not less than 99.99% by mass %, a relative density of not less than 98%, and an average grain size of less than 2 μm, and the sputtering target has a shape of a disc with an erosion surface continuous with a periphery of the disc.

2. The sputtering target according to claim 1, wherein the relative density is not less than 99%.

* * * * *